United States Patent
Hassan et al.

[11] Patent Number: 5,809,043
[45] Date of Patent: Sep. 15, 1998

[54] METHOD AND APPARATUS FOR DECODING BLOCK CODES

[75] Inventors: Amer A. Hassan, Kirkland, Wash.; Ali S. Khayrallah, Apex, N.C.; Harro Osthoff, Nuremberg, Germany

[73] Assignee: Ericsson Inc., Research Triangle Park, N.C.

[21] Appl. No.: 727,736

[22] Filed: Oct. 8, 1996

[51] Int. Cl.$^6$ .................................................. H03M 13/00
[52] U.S. Cl. ............................................................ 371/37.06
[58] Field of Search ............................... 371/37.06, 43.4

[56] References Cited

U.S. PATENT DOCUMENTS

| | | | |
|---|---|---|---|
| 4,821,268 | 4/1989 | Berlekamp | 371/37 |
| 4,835,772 | 5/1989 | Peile et al. | 371/2 |
| 5,457,704 | 10/1995 | Hoeher et al. | 371/43 |

FOREIGN PATENT DOCUMENTS

| | | |
|---|---|---|
| 0084913 | 8/1983 | European Pat. Off. . |
| 0095028 | 11/1983 | European Pat. Off. . |
| 0095669 | 12/1983 | European Pat. Off. . |
| 0105402 | 4/1984 | European Pat. Off. . |
| 0120371 | 10/1984 | European Pat. Off. . |
| 0606724 | 7/1994 | European Pat. Off. . |

*Primary Examiner*—Stephen M. Baker
*Attorney, Agent, or Firm*—Jenkens & Gilchrist

[57] ABSTRACT

A decoding system processes a received vector r to produce a soft symbol information vector output s including a reliability value for each received code symbol. From the reliability values, clusters of symbols within the received vector r having low reliability are identified and detected. Responsive thereto, the received vector r is permuted to scatter the low reliability symbols within each detected low reliability cluster throughout a given codeword. A decoding generator matrix G is also correspondingly permuted is response to the detection of low reliability clusters of symbols. Utilizing a trellis obtained from the permuted decoding generator matrix G', the permuted received vector r' is then sequentially or otherwise suboptimally decoded.

19 Claims, 3 Drawing Sheets

METHOD AND APPARATUS FOR DECODING BLOCK CODES

BACKGROUND OF THE INVENTION

1. Technical Field of the Invention

The present invention relates to the decoding of digital data transmitted over a communications channel and, in particular, to a decoder that detects noisy sections of a received signal (potentially including a burst of errors), and then permutes the code symbols of the received noisy signal to scatter the burst of errors prior to performing either sequential decoding or another suboptimal decoding technique.

2. Description of Related Art

There exist many applications where large volumes of digital data must be transmitted and received in a substantially error free manner. In telecommunications systems, in particular, it is imperative that the reception of digital data be accomplished as reliably as is possible. Reliable communication of digital data is difficult, however, because the communications channels (including radio frequency, fiber optic, coaxial cable, and twisted copper wire) utilized for data transmission are plagued by error introducing factors. For example, such errors may be attributable to transient conditions in the channel (like noise or multi-path fading). The influence of such factors results in instances where the digital data is not transmitted properly or cannot be reliably received.

Considerable attention has been directed toward overcoming this problem and reducing the number of errors incurred when transmitting data. One option involves increasing transmitter power. However, this is typically not practical due to limitations regarding transmitter electronics, regulations on peak power transmission, and the added expense involved in increasing power levels. An alternative option for combating noise on the communications channel is to introduce redundancy in the transmitted message which is used at the receiver to correct introduced errors. Such redundancy is typically implemented through the use of error control coding (channel codes).

The errors that typically occur during the transmission of data over a communications channel may be generally classified as one of two types. The first type, referred to as a "random" error, occurs when the symbols in error are spread out across the codeword. The second type, referred to as a "burst" error, occurs when clusters of symbols within a codeword are in error. The most powerful error control coding techniques are those which are designed to detect and correct random errors rather than bursty errors, although some such techniques do have the capability of correcting short burst errors. There would be an advantage if powerful random error control coding techniques could be used to provide effective error detection and correction as well for instances of burst errors.

Decoding algorithms exist whose computational complexity varies with received signal quality. That is, the decoding algorithm searches more extensively for the correct transmitted signal when the received signal is weak. One problem experienced with such decoding algorithms is that they cannot be used when the code rate needed for transmission over the channel exceeds the cut-off rate for that channel. Another problem is that such decoding algorithms are ineffective, even for code rates below the cut-off rate, when the received signal is very noisy. The reason for this is that the decoder has the ability to backtrack in instances when the current estimate along a decoding trellis is deemed unreliable, and accordingly, for a particularly noisy section, it takes a long time before the backtracking process is satisfactorily completed and an estimate of the transmitted signal is output. In performing this backtracking processing operation, however, the decoder may exhaust its storage and or processing resources before reaching a satisfactory conclusion, and thus become stuck and fail to produce a transmitted signal output estimate. There would be an advantage if a variable computational complexity decoding algorithm could be efficiently implemented to handle, preferably in conjunction with the most powerful random error control coding techniques available, instances of bursty errors within data communications transmitted over noisy communications channels.

SUMMARY OF THE INVENTION

To address the foregoing and other problems, the decoding system of the present invention includes a demodulator which receives the output of a transmission channel and generates a received vector r including estimates of code symbols. The demodulator further outputs a soft symbol information vector output s including a reliability value for each received and estimated code symbol. The reliability values of the soft symbol information vector output s are then used to identify and detect clusters of code symbols within the received vector r having low reliability. Responsive to such a detection, the estimated code symbols of the received vector r are permuted and then sequentially decoded (or alternatively decoded using another suboptimal technique) in accordance with a trellis for a decoding generator matrix G which has been correspondingly permuted. In instances where few or no low reliability clusters of code symbols are detected, the received vector r is sequentially decoded (or decoded using another suboptimal technique) in accordance with a trellis for the non-permuted decoding generator matrix G. The permutation of the received vector r advantageously scatters the code symbols within each detected low reliability cluster throughout a given codeword prior to decoding and thus minimizes the likelihood of the occurrence of either processing delays or, more seriously, decoder failure due to decoder backtracking while implementing the decoding algorithm.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
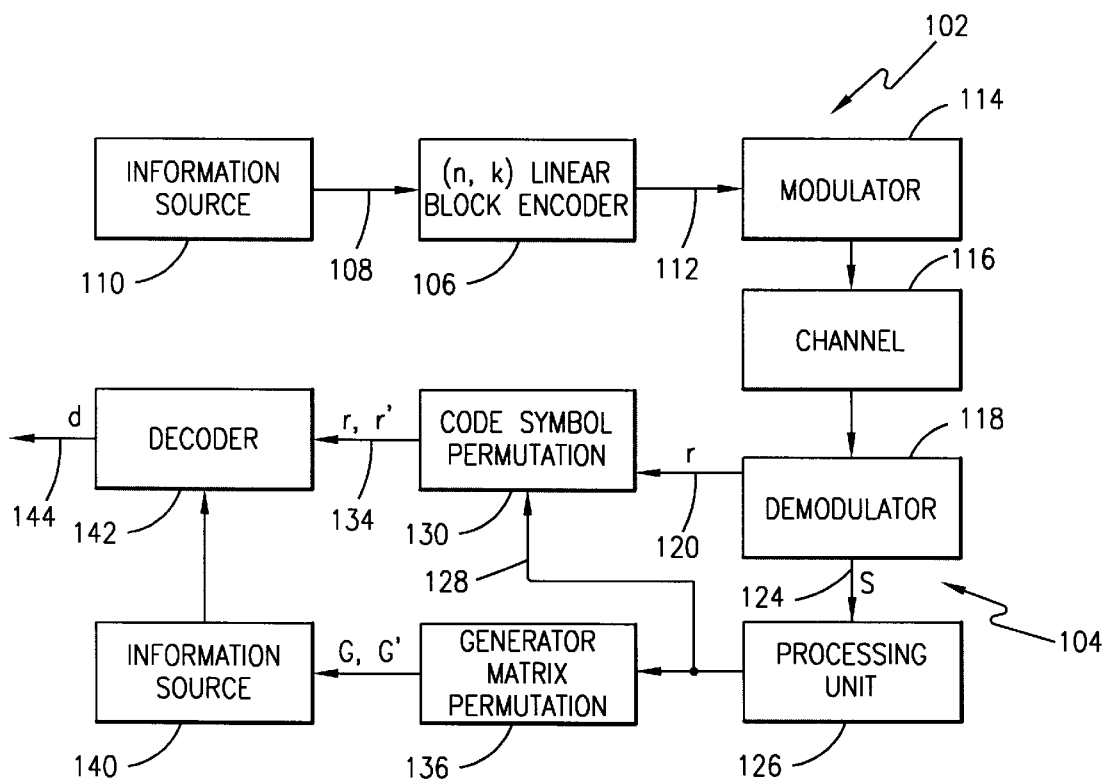
FIG. 1 is a functional block diagram of a block coding system of the present invention.

Reference is now made to FIG. 1, wherein there is shown a block diagram of a block coding system 100 of the present invention. The system 100 includes a transmit side 102 and a receive side 104. On the transmit side 102, the system 100 includes an (n,k) linear block encoder 106 wherein a block of "k" information symbols received on line 108 from an information source 110 is encoded to output on line 112 a codeword of "n" code symbols in length (wherein n>k). An example of such an encoder 106 is an M-ary block Reed-Solomon encoder. Each codeword includes m check symbols (wherein m=n−k) among the n code symbols, with the check symbols being useful in later detecting (and perhaps correcting) t number of channel errors introduced into the (n,k) code, where t depends on the particular code being used.

The information symbols $(d_1,d_2,d_3, \ldots, d_k)$ in each block received from the information source 110 comprise a k-dimensional information vector d. The (n,k) linear block code is realized by a generator matrix G:

$$G=[g_1, g_2, \ldots, g_n] \quad (1)$$

wherein: $g_i$, for i=1 to n, is the i-th column vector of length k.

Similarly, the code symbols $(c_1,c_2,c_3, \ldots, c_n)$ in each output codeword comprise an n-dimensional codeword vector c. The information vector d is multiplied by the generator matrix G to produce the output codeword vector c as follows:

$$c=dG=(c_1, c_2, \ldots, c_n) \quad (2)$$

The encoded output vector c is then modulated by a modulator 114 for transmission over a communications channel 116. An example of such a modulator 114 is any known modulator having an M-ary signal constellation (such as quadrature amplitude modulation (QAM) or phase shift keying (PSK)).

The communications channel 116 over which the modulated encoded output vector c is transmitted may introduce a number of random and/or burst errors in the included code symbols $c_i$, for i=1 to n. The result of this effect are received code symbols $(r_1,r_2,r_3, \ldots, r_n)$ comprising an n-dimensional encoded receive vector r. On the receive side 104, the system 100 includes an appropriate demodulator 118 that demodulates the communications channel 116 transmitted communication and outputs on line 120 estimates of code symbols $(r_1,r_2,r_3, \ldots, r_n)$ for the receive vector r. The demodulator 118 further outputs a soft symbol information vector output $s=(s_1, s_2, s_3, \ldots, s_n)$ on line 124, wherein $s_i$ comprises a reliability value for the corresponding estimated code symbol $r_i$, for i=1 to n. The reliability values are indicative of the level of confidence expressed by the demodulator 118 in its estimate of a particular received and demodulated code symbol $r_i$. Thus, a smaller reliability value $s_i$ indicates a higher likelihood of the corresponding code symbol $r_i$ being estimated incorrectly. Demodulators, like that described above, producing code symbol estimates $r_i$ and reliability values $s_i$ are well known in the art, and thus will not be further described. Examples of such demodulators include: a maximum aposterior probability (MAP) demodulator, or a soft output Viterbi algorithm (SOVA) demodulator/decoder.

Figure 2:
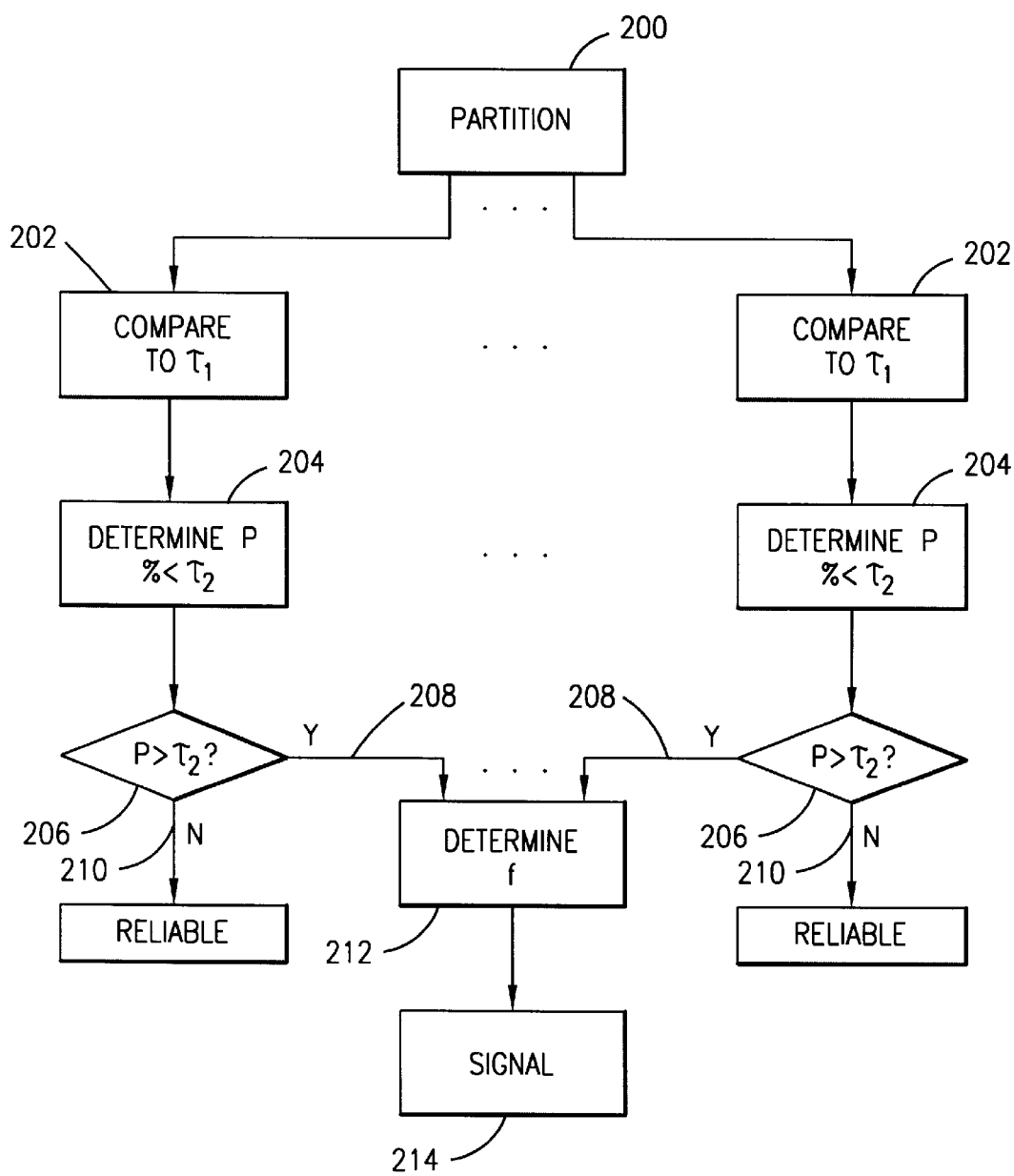
FIG. 2 is a flow diagram illustrating a process implemented by the system of FIG. 1 in identifying clusters of symbols with low reliability.

A soft information processing unit 126 receives the soft symbol information vector output $s=(s_1, s_2, s_3, \ldots, s_n)$ on line 124. The included reliability values $s_i$ for the vector s indicative of the demodulator's level of confidence in its estimate of a particular received and demodulated code symbol $r_i$ are processed to identify and detect clusters of code symbols with low reliability. In accordance with this process (see FIG. 2), the vector s is partitioned (step 200) into L contiguous regions, where each region includes N reliability values $s_i$:

$$(s_1, \ldots, s_N)(s_{N+1}, \ldots, s_{2N}) \ldots (s_{(L-1)N+1}, \ldots, s_n).$$

L and N are chosen so as to satisfy $LN \leq n < (L+1)N$. Next, for each of the L regions, each of the reliability values $s_i$ in that selected region is compared to a threshold value $\tau_1$ (step 202). A determination is then made (step 204) of the percentage of code symbols contained within that region having reliability values below the threshold value $\tau_1$. If that determined percentage exceeds a percentage threshold $\tau_2$ (step 206), the region is identified (flow 208) as containing a low reliability cluster. Otherwise (flow 210), the region is identified as a reliable cluster. Responsive to the identifications from the flows 208 of low reliability clusters, a permutation function f is determined in step 212, and the processing unit 126 generates and outputs a permutation signal on line 128 (step 214).

Consider now a permutation of a vector v to a vector v' such that the information contained at a certain location i in vector v now occupies a new location j in vector v', wherein j=f(i) and f comprises the permutation function. The permutation function f could comprise a mathematical scrambling or scattering operation. For example, suppose W out of the L regions of vector v are identified as being unreliable. For simplicity, we do not distinguish among reliable and unreliable symbols within an unreliable cluster. The number w of symbols to be scattered is WN if the last cluster is reliable, and is equal to (W−1)N+n−(L−1)N if the last cluster is unreliable. At this point, it is more convenient to deal with the indices of symbols instead of the symbols themselves. One way of scattering the w indices is to use a periodic position assignment having a period equal to the integer part of n/w. Another way is to use a pseudo-random w out of n position assignment. In either case, the w indices are first mapped to new positions in accordance with the scattering assignment within the vector v'. Next, the remaining n−w indices are mapped, in order, to the unfilled positions. Overall, this defines a permutation f from the old indices to the new indices within the vector v'.

Take now, for example, a vector s wherein n=16, L=4 and N=4. The four regions are checked using the thresholds $\tau_1$ and $\tau_2$. Suppose region three, comprising indices 9–12, is deemed unreliable. Regions one, two and four are deemed reliable. Utilizing a pseudo-random map, the old indices 9–12 are assigned to new indices between 1 and n. In this example, suppose, the map assigns old index 9 to new index 2, old index 10 to new index 14, old index 11 to new index 9, and old index 12 to new index 7. The remaining indices 1–8 and 13–16 for regions one, two and four are now assigned in order to the unoccupied new indices. Overall, this defines a permutation function f given by the following:

| f (1) = 1 | f (2) = 3 | f (3) = 4 | f (4) = 5 |
|---|---|---|---|
| f (5) = 6 | f (6) = 8 | f (7) = 10 | f (8) = 11 |
| f (9) = 2 | f (10) = 14 | f (11) = 9 | f (12) = 7 |
| f (13) = 12 | f (14) = 13 | f (15) = 15 | f (16) = 16 |

Extending this permutation concept to the received vector r realizes a permuted received vector r':

$$r'=(r'_1, r'_2, \ldots, r'_n) \quad (3)$$

wherein:
  $r'_j=r_i$, where j=f(i)
  f is the permutation function;
  $r_i$, for i=1 to n, are the received estimates of the code symbols; and
  $r'_j$, for j=1 to n, are the permuted estimates of the code symbols.

When none of the L regions is identified as being unreliable, there is no need to permute. Conversely, when all of the regions L are identified as being unreliable, permutation may not be helpful, and accordingly it may be better to delete the received vector r corresponding to the vector s. Similarly extending this concept to the generator matrix G realizes a permuted generator matrix G':

$$G'=[g'_1, g'_2, \ldots, g'_n] \qquad (4)$$

wherein:

$g'_j=g_i$, where $j=f(i)$;

f is the permutation function;

$g_i$, for i=1 to n, is the i-th column vector of length k for G; and $g'_j$, for j=1 to n, is the j-th column vector of length k for G'.

It is noted that the permuted generator matrix G' and the generator matrix G are realizations of equivalent codes. By this it is meant codes having the same weight distribution and the same error correcting capability. It is further noted that if the permutation function f with respect to both the received vector r and the generator matrix G are the same, then permuted generator matrix G' could be used in decoding the permuted received vector r'.

The system 100 further includes a demodulated code symbol permutation element 130 connected to the demodulator 118 by line 120 to receive demodulated code symbols for the received vector r, and connected to the processing unit 126 to receive the permutation signal on line 128. Responsive to receipt of the permutation signal from processing unit 126, the demodulated code symbol permutation element 130 operates to permute, in accordance with a certain permutation function f, the demodulated code symbols of the received vector r and output a permuted received vector r' on line 134. This operation advantageously scatters the identified low reliability cluster of code symbols throughout a given codeword. When the permutation signal is not received by the demodulated code symbol permutation element 130, however, the code symbols of the received vector r are instead passed through without modification also for output on line 134.

A corresponding generator matrix permutation element 136 is connected to the processing unit 126 to receive the permutation signal on line 128. The generator matrix permutation element 136 is pre-programmed with the generator matrix G needed to decode the received vector r. Responsive to receipt of the permutation signal from processing unit 126, the generator matrix permutation element 136 operates to permute, in accordance with the certain permutation function f, the generator matrix G and output a permuted generator matrix G' on line 138. Use of the same certain permutation function f by the generator matrix permutation element 136 insures that the permuted generator matrix G' corresponds for subsequent decoding processing to the permuted received vector r' output by the demodulated symbol permutation element 130. When the permutation signal is not received by the generator matrix permutation element 136, however, the generator matrix G is instead output without modification on line 138.

In one embodiment of the present invention, the permutation function f is pre-selected and pre-programmed as a function of the soft symbol information vector s into both the demodulated code symbol permutation element 130 and the generator matrix permutation element 136. In an alternative embodiment, the processing unit 126 not only determines whether the permutation signal should be sent, but also determines which of a number of available permutation functions f should be implemented by the demodulated code symbol permutation element 130 and the generator matrix permutation element 136. This information identifying the best permutation function is supplied to the demodulated code symbol permutation element 130 and the generator matrix permutation element 136 along with the permutation signal itself.

The generator matrix G or the permuted generator matrix G' output by the generator matrix permutation element 136 on line 138 depending on the processing unit 126 generated permutation signal is then processed by a trellis generator 140. The trellis generator 140 implements any one of a number of known techniques for finding a corresponding trellis from a given generator matrix. In this connection, however, it will be noted that the trellis produced by the trellis generator 140 for the generator matrix G differs from the trellis for the permuted generator matrix G'.

A decoder 142 receives the received vector r or permuted received vector r' output from the demodulated code symbol permutation element 130 on line 134 depending on the processing unit 126 generated permutation signal. The decoder 142 implements a particular sequential decoding algorithm, or other suboptimal decoding algorithm, chosen from those known to those skilled in the art, and utilizing the trellis produced by the trellis generator 140 from the corresponding generator matrix G or the permuted generator matrix G' decodes the received vector r or permuted received vector r', respectively, to output on line 144 the resulting information vector d. Accordingly, when the reliability of the code symbols is not in question, the received vector r is passed on to the decoder 142 for processing in view of the trellis produced by the trellis generator 140 from the generator matrix G. Conversely, when the soft information processing unit 126 detects a low reliability cluster of code symbols and outputs the permutation signal on line 128, the permuted received vector r' is output for processing by the decoder 142 using the trellis produced by the trellis generator 140 from the permuted generator matrix G'. The effect of the permutation of the received vector r is to scatter the identified low reliability cluster of symbols throughout a given codeword and minimize the likelihood of the occurrence of either processing delays or, more seriously, decoder failure due to decoder backtracking. Corresponding permutation of the generator matrix G insures that the proper trellis (obtained from the permuted generator matrix G') is made available for used by the decoder 142 in processing the permuted received vector r'.

The soft information processing unit 126, the demodulated code symbol permutation element 130, the generator matrix permutation element 136, the trellis generator 140, and the decoder 142 are all preferably implemented as a specialized digital signal processor (DSP) or in an application specific integrated circuit (ASIC). It will, of course, be understood that the soft information processing unit 126, the demodulated code symbol permutation element 130, the generator matrix permutation element 136, the trellis generator 140, and the decoder 142 may alternatively be implemented using discrete components and perhaps distributed processing. In either case, the soft information processing unit 126, the demodulated code symbol permutation element 130, the generator matrix permutation element 136, the trellis generator 140, and the decoder 142 each perform and implement the functional operations previously described.

Figure 3:
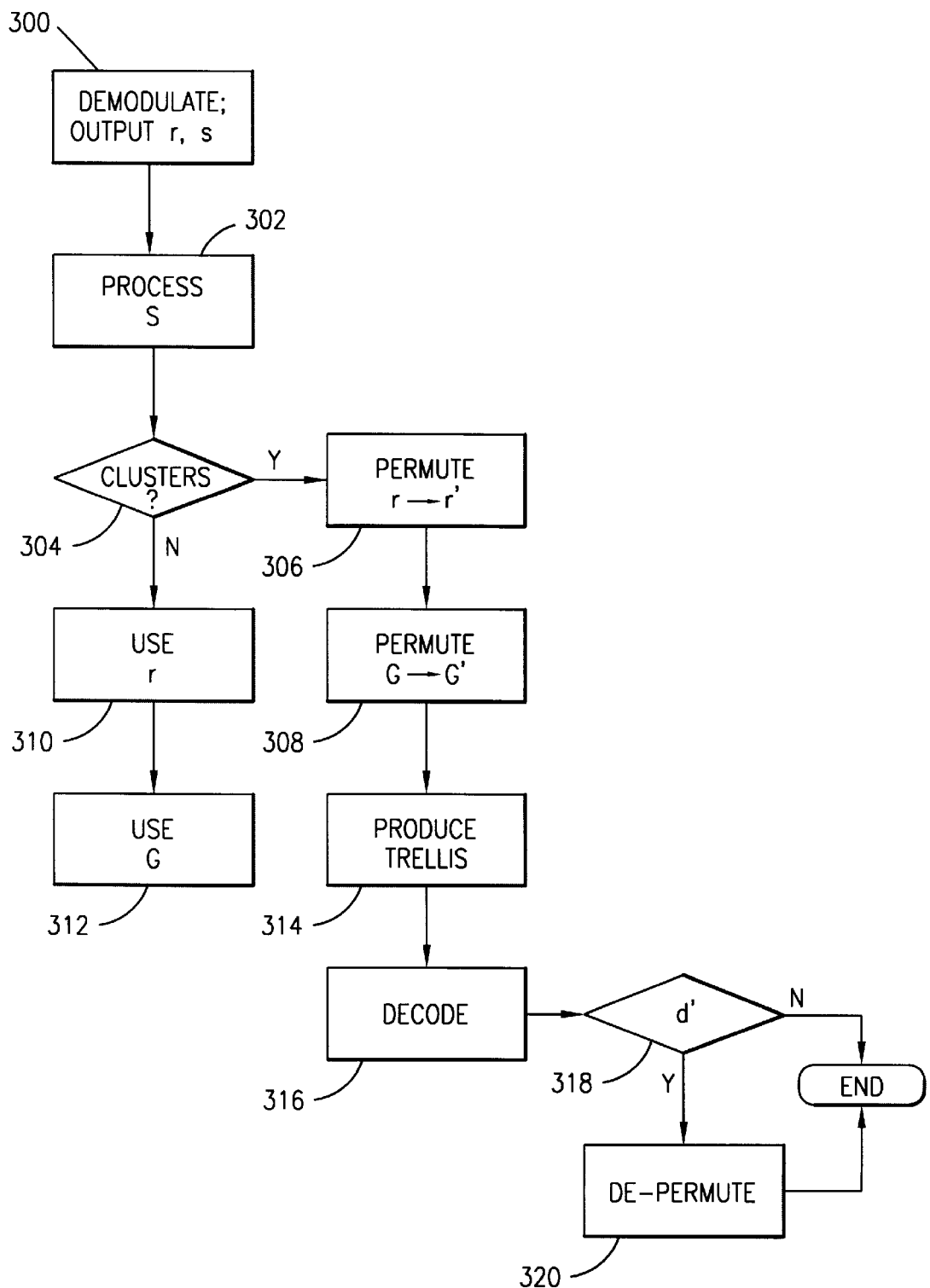
FIG. 3 is a flow diagram illustrating a process implemented by the system of FIG. 1 for decoding block codes.

Reference is now made to FIG. 3 wherein there is shown a flow diagram illustrating a process implemented by the system of FIG. 1 for decoding block codes. In step 300, a received vector r is demodulated to generate estimates of code symbols $(r_1, r_2, r_3, \ldots, r_n)$ for the received vector r, and a soft symbol information vector output $s=(s_1, s_2, s_3, \ldots, S_n)$ wherein $s_i$ comprises a reliability value for the corresponding estimated code symbol $r_i$. Next, in step 302, the soft symbol information vector output s is processed, in accordance with the method shown in FIG. 2, to identify and detect clusters of code symbols with low reliability. If such clusters exist, as determined by decision step 304, the code symbol estimates for the received vector r are permuted in step 306 in accordance with a certain permutation function f. The generator matrix G needed to decode the received vector r is then also permuted in step 308 in accordance with the same certain permutation function f. Use of the same certain permutation function f in steps 306 and 308 insures that the permuted generator matrix G' corresponds for decoding processing to the permuted received vector r'. In instances where clusters of code symbols with low reliability are not detected, as determined by decision step 304, the code symbol estimates for the received vector r are not permuted in step 310 and the generator matrix G is made available in step 312. Next, in step 314, a decoding trellis is produced from the generator matrix G or the permuted generator matrix G', as appropriate for the detection of clusters of code symbols with low reliability. The produced trellis is then used in step 316 to decode the received vector r or permuted received vector r' using a particular sequential decoding algorithm, or other suboptimal decoding algorithm, to generate the resulting information vector d or permuted resulting information vector d'. If the permuted resulting information vector d' is generated from decoding the permuted received vector r', as determined in step 318, it is de-permuted in step 320.

Although preferred embodiments of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A decoding method, comprising the steps of:
   determining a reliability vector s for a received vector r;
   processing the reliability vector s to identify a cluster of code symbols within the received vector r with low reliability;
   permuting the received vector r in accordance with a certain permutation function to scatter the low reliability code symbols throughout a codeword of a permuted received vector r'; and
   decoding the codeword of the permuted received vector r' to recover a resulting information vector d.

2. The method as in claim 1 wherein the step of processing the reliability vector s comprises the steps of:
   selecting a region within a given codeword of the received vector r;
   comparing each of the reliability values for the code symbols in that selected region to a first threshold value;
   determining a percentage of code symbols contained within that selected region having reliability values below the first threshold value;
   identifying a low reliability cluster of code symbols if the determined percentage exceeds a second threshold value.

3. The method as in claim 1 wherein the step of permuting the received vector r in accordance with the certain permutation function comprises the steps of:
   making a periodic position assignment in the permuted received vector r' of the low reliability code symbols; and
   assigning to remaining positions in the permuted received vector r' any remaining code symbols.

4. The method as in claim 1 wherein the step of permuting the received vector r in accordance with the certain permutation function comprises the steps of:
   making a pseudo-random position assignment in the permuted received vector r' of the low reliability code symbols; and
   assigning to remaining positions in the permuted received vector r' any remaining code symbols.

5. The method as in claim 1 wherein the step of decoding the codeword of the permuted received vector r' comprises the steps of:
   constructing a decoding trellis from a generator matrix G correspondingly permuted in accordance with the same certain permutation function to form permuted generator matrix G';
   sequentially decoding the codeword of the permuted received vector r' using the decoding trellis constructed from the correspondingly permuted generator matrix G' to generate the resulting information vector d.

6. The method as in claim 1 wherein the step of decoding the codeword of the permuted received vector r' comprises the steps of:
   constructing a decoding trellis from a generator matrix G correspondingly permuted in accordance with the same certain permutation function to form permuted generator matrix G';
   suboptimally decoding the codeword of the permuted received vector r' using the decoding trellis constructed from the correspondingly permuted generator matrix G' to generate the resulting information vector d.

7. A decoding system, comprising:
   a demodulator for outputting estimates of code symbols within a received vector r and for outputting a reliability vector s including reliability values for each estimated code symbol within the received vector r;
   means for processing the reliability values of the reliability vector s to identify a cluster of code symbols within the received vector r with low reliability;
   means for permuting the received vector r in accordance with a certain permutation function to scatter the low reliability code symbols throughout a codeword of a permuted received vector r'; and
   a decoder for decoding the codeword of the permuted received vector r' to recover a resulting information vector d.

8. The system of claim 7 wherein the means for permuting implements periodic position assignment of the low reliability code symbols in the permuted received vector r'.

9. The system of claim 7 wherein the means for permuting implements pseudo-random position assignment of the low reliability code symbols in the permuted received vector r'.

10. The system of claim 7 further including means for constructing a decoding trellis from a generator matrix G correspondingly permuted in accordance with the same certain permutation function to form permuted generator matrix G'.

11. The system of claim 10 wherein the decoder implements a sequential decoding algorithm in decoding the codeword of the permuted received vector r' using the decoding trellis constructed from the correspondingly permuted generator matrix G'.

12. The system of claim 10 wherein the decoder implements a suboptimal decoding algorithm in decoding the codeword of the permuted received vector r' using the decoding trellis constructed from the correspondingly permuted generator matrix G'.

13. A method for improving the decoding of a received vector r including a low reliability cluster of code symbols, comprising the steps of:

permuting the received vector to generate a permuted received vector r' by scattering the low reliability code words throughout a codeword; and decoding the permuted received vector r'.

14. The method as in claim 13 wherein the step of scattering comprises the step of implementing periodic position assignment of the low reliability code symbols in the permuted received vector r'.

15. The method as in claim 13 wherein the step of scattering comprises the step of implementing pseudo-random position assignment of the low reliability code symbols in the permuted received vector r'.

16. The method as in claim 13 wherein the step of decoding comprises the steps of:

correspondingly permuting a generator matrix G to produce a permuted generator matrix G';

constructing a decoding trellis from the permuted generator matrix G'; and decoding the permuted received vector r' in accordance with the constructed decoding trellis.

17. The method as in claim 16 wherein the step of decoding comprises the step of sequentially decoding the codeword of the permuted received vector r' using the decoding trellis constructed from the correspondingly permuted generator matrix G'.

18. The method as in claim 16 wherein the step of decoding comprises the step of suboptimally decoding the codeword of the permuted received vector r' using the decoding trellis constructed from the correspondingly permuted generator matrix G'.

19. A method for detecting low reliability clusters of estimated code symbols within a received vector r, comprising the steps of:

generating a reliability vector s including reliability values for the estimated code symbols within the received vector r;

partitioning the reliability vector s into at least one region; and for each region, comparing the reliability values to a first threshold value;

determining a percentage of code symbols contained within that region having reliability values below the first threshold value;

identifying the portion of the received vector r corresponding to that region as having a low reliability cluster of code symbols therein if the determined percentage exceeds a second threshold value.

* * * * *